(12) United States Patent
Chiang

(10) Patent No.: US 10,962,591 B2
(45) Date of Patent: Mar. 30, 2021

(54) WAFER SURFACE TEST PREPROCESSING DEVICE AND WAFER SURFACE TEST APPARATUS HAVING THE SAME

(71) Applicant: Te-Ming Chiang, Hsinchu (TW)

(72) Inventor: Te-Ming Chiang, Hsinchu (TW)

(*) Notice: Subject to any disclaimer, the term of this patent is extended or adjusted under 35 U.S.C. 154(b) by 192 days.

(21) Appl. No.: 16/253,466

(22) Filed: Jan. 22, 2019

(65) Prior Publication Data
US 2020/0057105 A1 Feb. 20, 2020

(30) Foreign Application Priority Data
Aug. 16, 2018 (TW) .................... 107128594

(51) Int. Cl.
  H01L 21/02 (2006.01)
  G01R 31/28 (2006.01)
  H01L 21/67 (2006.01)
(52) U.S. Cl.
  CPC .... G01R 31/2898 (2013.01); H01L 21/02019 (2013.01); H01L 21/6708 (2013.01)
(58) Field of Classification Search
  CPC .......... G01R 31/2898; H01L 21/02019; H01L 21/6708
  USPC .................................. 73/104, 105
  See application file for complete search history.

(56) References Cited

U.S. PATENT DOCUMENTS

| 4,360,964 A * | 11/1982 | Gilly ................. | G01R 31/2831 257/48 |
| 4,755,746 A * | 7/1988 | Mallory ............. | G01R 31/2831 324/762.05 |
| 5,725,753 A * | 3/1998 | Harada ............... | B08B 3/10 134/1.3 |
| 7,068,056 B1 * | 6/2006 | Gibbs ................. | G01R 31/2891 324/750.16 |
| 7,262,617 B2 * | 8/2007 | Komatsu ............ | G01R 31/2891 324/750.25 |
| 2012/0149182 A1 * | 6/2012 | Rey Garcia ......... | H01L 31/1804 438/558 |
| 2014/0041682 A1 * | 2/2014 | Monden ............. | H01J 37/32522 134/1 |
| 2020/0173942 A1 * | 6/2020 | Kasai ................. | G01R 31/2877 |

* cited by examiner

*Primary Examiner* — Eric S. McCall
(74) *Attorney, Agent, or Firm* — Schmeiser, Olsen & Watts, LLP

(57) ABSTRACT

A wafer surface test preprocessing device includes a chamber; a supporting component disposed in the chamber; an atomizer connected to a lateral side of the chamber; a cooling component connected to a bottom of the chamber; and a lid disposed on a top of the chamber. With the wafer surface test preprocessing device having the cooling component to thereby dispense with a ventilation device and collect hydrofluoric acid residues in the chamber at the bottom of the chamber, thereby saving costs and time effectively.

7 Claims, 4 Drawing Sheets

WAFER SURFACE TEST PREPROCESSING DEVICE AND WAFER SURFACE TEST APPARATUS HAVING THE SAME

CROSS-REFERENCE TO RELATED APPLICATION

This non-provisional application claims priority under 35 U.S.C. § 119(a) on Patent Application No(s). 107128594 filed in Taiwan, R.O.C. on Aug. 16, 2018, the entire contents of which are hereby incorporated by reference.

FIELD OF THE INVENTION

The present disclosure relates to a wafer surface test preprocessing device and a wafer surface test apparatus having the same and, more particularly, to a wafer surface test preprocessing device for preprocessing metallic impurities of the test wafer surface and a wafer surface test apparatus having the same.

BACKGROUND OF THE INVENTION

With semiconductor devices being increasingly widely used in daily life and semiconductor processes being increasingly sophisticated, acceptable concentrations of metallic impurities of semiconductor wafers are becoming lower. As a result, an indispensable test carried out in a semiconductor process is analysis of wafer surface metallic impurities.

In general, by vapor phase decomposition (VPD) technology, hydrofluoric acid (HF) etches silicon dioxide on the wafer surface. After reacting with hydrofluoric acid, silicon dioxide spreads. Afterward, the metallic impurities on the wafer surface are collected again and analyzed.

With hydrofluoric acid being toxic, its fluoride ions are corrosive when released. Human beings exposed to hydrofluoric acid may have their hearts, livers, kidneys and nervous systems injured or may even been killed as a result. Hence, a ventilation device must be mounted on a container used in the aforesaid test process to remove hydrofluoric acid residues upon completion of the reaction of hydrofluoric acid and silicon dioxide. Afterward, the container is opened, so as to perform subsequent tests on the wafer.

However, the ventilation device not only incurs costs but also performs ventilation slowly. In view of this, it is imperative to provide a wafer surface test preprocessing device to solve the aforesaid problems.

SUMMARY OF THE INVENTION

It is an objective of the present disclosure to provide a wafer surface test preprocessing device for testing metallic impurities on a wafer surface and a wafer surface test apparatus having the wafer surface test preprocessing device to not only dispense with a ventilation apparatus which incurs costs and works slowly but also collects hydrofluoric acid quickly.

In order to achieve the above and other objectives, the present disclosure provides a wafer surface test preprocessing device, comprising: a chamber; a supporting component disposed in the chamber; an atomizer connected to a lateral side of the chamber; a cooling component connected to a bottom of the chamber; and a lid disposed on a top of the chamber.

In an embodiment of the present disclosure, the cooling component is a hydrocooling chamber.

In an embodiment of the present disclosure, the supporting component comprises a plurality of supporting posts.

In an embodiment of the present disclosure, the wafer surface test preprocessing device is made of PFA composite plastic.

In order to achieve the above and other objectives, the present disclosure provides a wafer surface test apparatus, comprising: the wafer surface test preprocessing device; and a test device for testing a wafer processed with the wafer surface test preprocessing device.

In this embodiment, the wafer surface test preprocessing device comprises the cooling component to thereby dispense with a ventilation device and collect at the bottom of the chamber quickly hydrofluoric acid residues in the chamber. By contrast, the conventional ventilation approach disclosed in the prior art is expensive and time-inefficient.

DETAILED DESCRIPTION OF THE PREFERRED EMBODIMENTS

Objectives, features, and advantages of the present disclosure are hereunder illustrated with specific embodiments, depicted with drawings, and described below. The present disclosure is implemented or applied by other different, specific embodiments. Various modifications and changes can be made in accordance with different viewpoints and applications to details disclosed herein without departing from the spirit of the present disclosure. Furthermore, the accompanying drawings of the present disclosure are illustrative but are not drawn to scale. Technical features of the present disclosure are illustrated by embodiments and described below, but the embodiments are not restrictive of the claims of the present disclosure.

Figure 1:
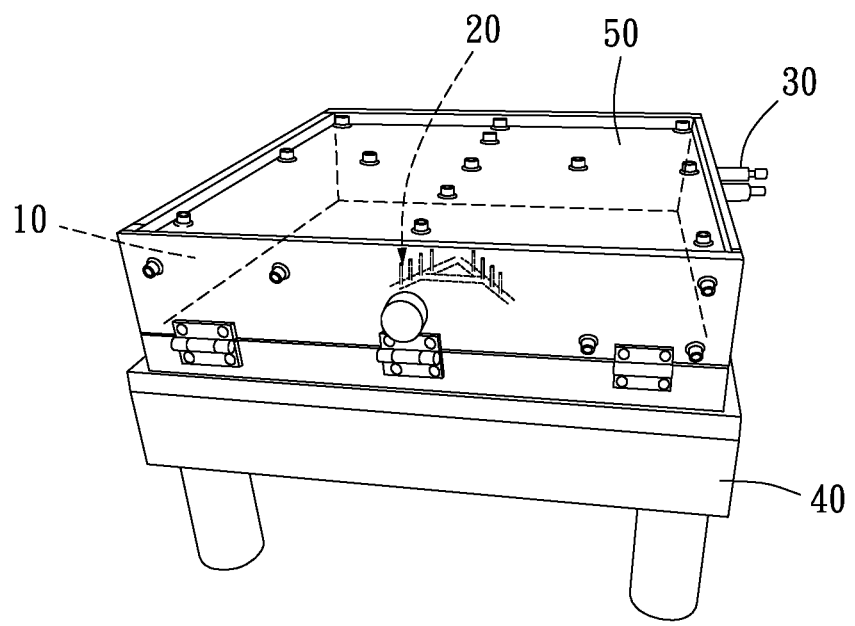
FIG. 1 is a schematic view of a wafer surface test preprocessing device according to an embodiment of the present disclosure.

FIG. 1 is a schematic view of a wafer surface test preprocessing device 1 according to an embodiment of the present disclosure. The wafer surface test preprocessing device 1 is for use in a front end process performed on metallic impurities of the test wafer surface.

As shown in FIG. 1, in this embodiment, the wafer surface test preprocessing device 1 comprises a chamber 10, a supporting component 20, an atomizer 30, a cooling component 40 and a lid 50. The supporting component 20 is disposed in the chamber 10. The atomizer 30 is connected to a lateral side of the chamber 10. The cooling component 40 is connected to the bottom of the chamber 10. The lid 50 is disposed on the top of the chamber 10.

Figure 2:
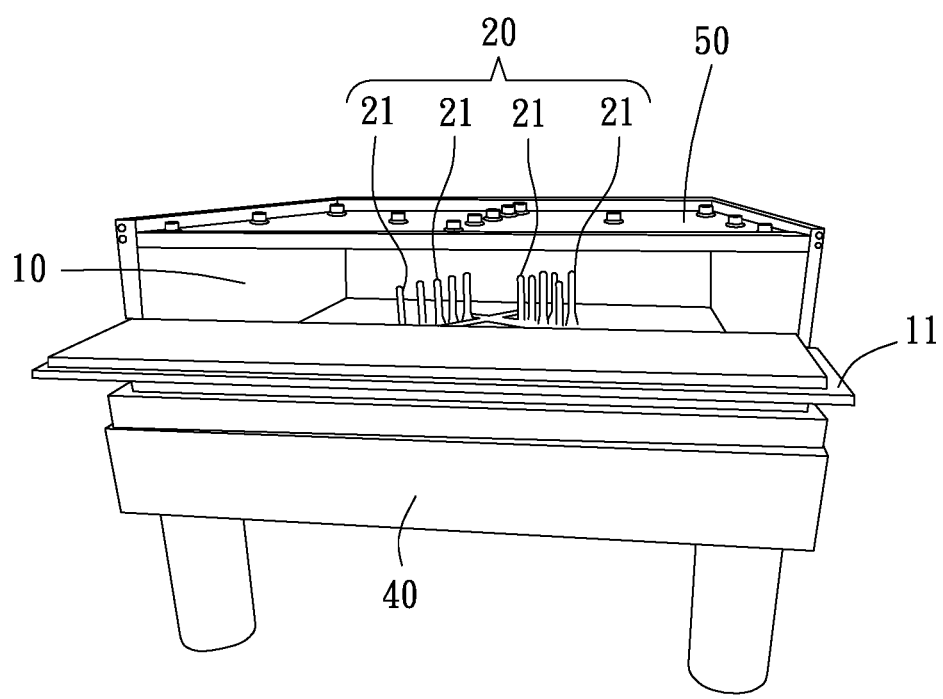
FIG. 2 is a schematic view of the wafer surface test preprocessing device from another angle according to an embodiment of the present disclosure.

The supporting component 20 supports a wafer to be tested. FIG. 2 is a schematic view of the wafer surface test preprocessing device 1 from another angle according to an embodiment of the present disclosure. As shown in FIG. 2, the supporting component 20 comprises a plurality of supporting posts 21. The supporting posts 21 are each miniaturized to match their area of contact with a wafer but still underpin the wafer firmly. However, the supporting component 20 shown in FIG. 2 is merely illustrative of an embodiment of the present disclosure; hence, the shape of the supporting component 20 and the arrangement and quantity of the supporting posts 21 are not restricted to the embodiment.

The atomizer 30 introduces hydrofluoric acid into the chamber 10 and then atomizes the hydrofluoric acid therein to spray the atomized hydrofluoric acid on the surface of the wafer to be tested.

In this embodiment, the chamber 10 has a movable sidewall 11. When the movable sidewall 11 is open as shown in FIG. 2, the wafer can be placed in the chamber 10 or taken out of the chamber 10, but the present disclosure is not limited thereto. In a variant embodiment, the lid 50 is movable disposed on the top of the chamber 10 when the movable sidewall 11 is open, whereas the wafer can be placed in the chamber 10 or taken out of the chamber 10 when the lid 50 is open.

Figure 3A:
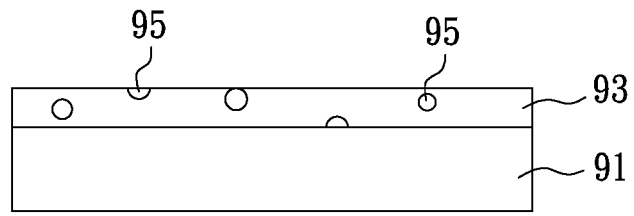
FIG. 3A is a schematic view of stages of surface treatment performed on a wafer with hydrofluoric acid.
Figure 3B:
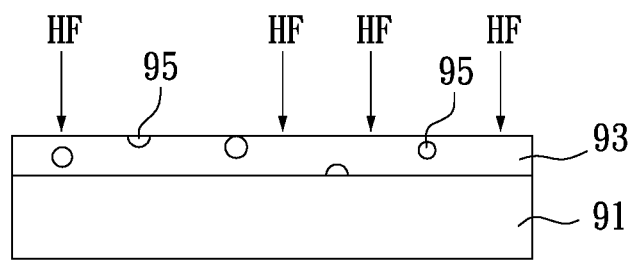
FIG. 3B is a schematic view of stages of surface treatment performed on a wafer with hydrofluoric acid.
Figure 3C:
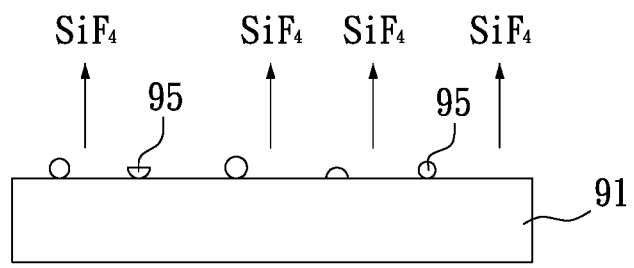
FIG. 3C is a schematic view of stages of surface treatment performed on a wafer with hydrofluoric acid.

FIG. 3A-FIG. 3C are schematic views of stages of surface treatment performed on a wafer 90 with hydrofluoric acid. As shown in FIG. 3A, the wafer 90 essentially comprises a silicon substrate layer 91 and a silicon dioxide layer 93 disposed on the silicon substrate layer 91. Metallic impurities 95 of the surface of the wafer 90 are disposed on the silicon dioxide layer 93. As shown in FIG. 3B, the wafer 90 to be tested is placed in the chamber 10 of the wafer surface test preprocessing device 1 and then placed on the supporting component 20 (the supporting posts 21). Afterward, the chamber 10 is hermetically sealed. Then, with the atomizer 30, hydrofluoric acid is introduced into the chamber 10 and atomized, so as to spray the atomized hydrofluoric acid onto the surface of the wafer 90. As shown in FIG. 3C, hydrofluoric acid reacts with the silicon dioxide layer 93 to produce $SiF_4$ and water ($SiO_2$+4 HF→$SiF_4$↑+$2H_2O$). $SiF_4$ spreads to the air and leaves behind the metallic impurities 95 and water on the silicon substrate layer 91.

The steps illustrated by FIG. 3B and FIG. 3C are about vapor phase decomposition (VPD) technology. Afterward, optionally, the wafer 90 is baked-dried (that is, removing water from the silicon substrate layer 91), and then the metallic impurities 95 on the silicon substrate layer 91 are collected and tested with a scan liquid, for example, in a subsequent step, so as to analyze the metallic impurities of the wafer surface. The step of collecting and testing the metallic impurities is not necessarily performed with a scan liquid.

Referring to FIG. 1 and FIG. 2, in an embodiment, the cooling component 40 is a hydrocooling chamber and is cooled down with a hydrocooling system such that the temperature of the bottom of the chamber 10 is around 10° C. Since hydrofluoric acid has a boiling point of around 19.54° C., the hydrofluoric acid gas introduced into the chamber 10 by the atomizer 30 comes into contact with the bottom of the chamber 10 and condenses into liquid hydrofluoric acid which then stays at the bottom of the chamber 10, thereby reducing the density of the hydrofluoric acid gas near the space of the bottom of the chamber 10. The portion of hydrofluoric acid which is not in contact with the silicon dioxide layer 93 or which does not react with the silicon dioxide layer 93 moves toward the bottom's space of a lower density, and then is condensed into liquid hydrofluoric acid because of the low temperature at the bottom.

The cooling technique and predetermined temperature of the cooling component 40 are chosen as needed but are not restricted to the aforesaid embodiment.

In an embodiment, the wafer surface test preprocessing device 1 is made of PFA composite plastic which is resistant to chemicals and is unlikely to be corroded by hydrofluoric acid gas or liquid hydrofluoric acid, but the present disclosure is not limited thereto. In a variant embodiment, the wafer surface test preprocessing device 1 is made of any other appropriate material.

In this embodiment, the wafer surface test preprocessing device 1 comprises the cooling component 40 to thereby dispense with a ventilation device and collect hydrofluoric acid residues in the chamber 10 at the bottom of the chamber 10, thereby saving costs effectively. The time (around 1 minute) taken for the hydrofluoric acid gas to be condensed at the bottom of the chamber 10 is shorter than the time taken to perform a ventilation process disclosed in the prior art; hence, the present disclosure saves time effectively. Afterward, the movable sidewall 11 (or the lid 50) is opened to take out the wafer or perform subsequent tests on the wafer in the chamber directly.

The hydrofluoric acid gas is condensed into liquid hydrofluoric acid and retained at the bottom of the chamber 10. Hence, the present disclosure is advantageous in that the wafer can be conveniently removed and need not be cleansed.

As mentioned before, in an embodiment of the present disclosure, the wafer surface test preprocessing device 1 comprises the cooling component 40 to thereby dispense with a ventilation device and collect hydrofluoric acid residues in the chamber 10 at the bottom of the chamber 10 quickly. By contrast, the conventional ventilation approach disclosed in the prior art is expensive and time-inefficient.

Figure 4:
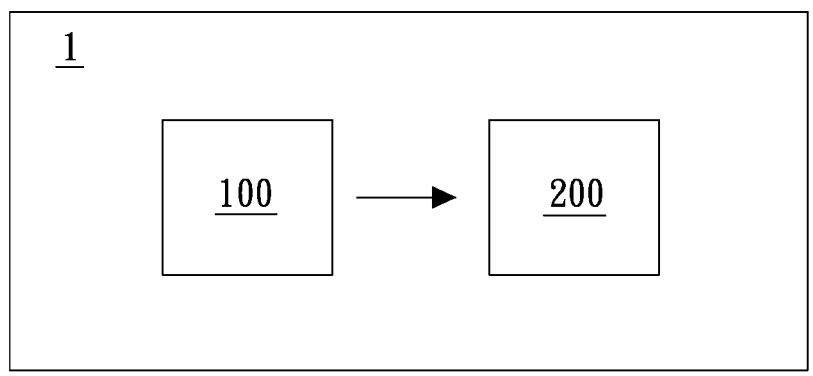
FIG. 4 is a block diagram of a wafer surface test apparatus according to an embodiment of the present disclosure.

FIG. 4 is a block diagram of a wafer surface test apparatus 1 according to an embodiment of the present disclosure. In this embodiment, the wafer surface test apparatus 1 comprises the wafer surface test preprocessing device 100 of the aforesaid embodiments and a test device 200. The test device 200 tests the wafer 90 processed with the wafer surface test preprocessing device 100.

For instance, the wafer 90 processed can be moved to the test device 2, and the test device 2 provides a scan liquid on the surface of the wafer 90, so as to collect the metallic impurities 95 on the surface of the wafer 90 and thus test and analyze the metallic impurities 95. Alternatively, the wafer 90 is retained on the supporting component 20 (the supporting posts 21), and just the movable sidewall 11 (or the lid 50) is opened to admit the test device 2 into the chamber 10 so as to test the wafer 90 processed with the wafer surface test preprocessing device 1.

The configuration of the test device 2, its components, and its operation are not restricted to the aforesaid embodiments and thus are subject to changes as needed.

The present disclosure is disclosed above by preferred embodiments. However, persons skilled in the art should understand that the preferred embodiments are illustrative of the present disclosure only, but shall not be interpreted as restrictive of the scope of the present disclosure. Hence, all equivalent modifications and replacements made to the aforesaid embodiments shall fall within the scope of the present disclosure. Accordingly, the legal protection for the present disclosure shall be defined by the appended claims.

What is claimed is:

1. A wafer surface test preprocessing device, comprising:
a chamber;
a supporting component disposed in the chamber;

an atomizer connected to a lateral side of the chamber;

a cooling component connected to a bottom of the chamber, wherein the cooling component is a hydrocooling chamber; and a lid disposed on a top of the chamber.

2. A wafer surface test apparatus, comprising:

the wafer surface test preprocessing device of claim 1; and a test device for testing a wafer processed with the wafer surface test preprocessing device.

3. A wafer surface test apparatus, comprising:

the wafer surface test preprocessing device of claim 1; and a test device for testing a wafer processed with the wafer surface test preprocessing device.

4. The wafer surface test preprocessing device of claim 1, wherein the supporting component comprises a plurality of supporting posts.

5. A wafer surface test apparatus, comprising:

the wafer surface test preprocessing device of claim 4; and a test device for testing a wafer processed with the wafer surface test preprocessing device.

6. The wafer surface test preprocessing device of claim 1, wherein the wafer surface test preprocessing device is made of PFA composite plastic.

7. A wafer surface test apparatus, comprising:

the wafer surface test preprocessing device of claim 6; and a test device for testing a wafer processed with the wafer surface test preprocessing device.

* * * * *